United States Patent
Cetegen et al.

(10) Patent No.: US 12,362,250 B2
(45) Date of Patent: *Jul. 15, 2025

(54) PROTRUDING SN SUBSTRATE FEATURES FOR EPOXY FLOW CONTROL

(71) Applicant: Intel Corporation, Santa Clara, CA (US)

(72) Inventors: Edvin Cetegen, Chandler, AZ (US); Jacob Vehonsky, Gilbert, AZ (US); Nicholas S. Haehn, Scottsdale, AZ (US); Thomas Heaton, Mesa, AZ (US); Steve S. Cho, Chandler, AZ (US); Rahul Jain, Gilbert, AZ (US); Tarek Ibrahim, Mesa, AZ (US); Antariksh Rao Pratap Singh, Gilbert, AZ (US); Nicholas Neal, Scottsdale, AZ (US); Sergio Chan Arguedas, Chandler, AZ (US); Vipul Mehta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,047

(22) Filed: Apr. 10, 2024

(65) Prior Publication Data
US 2024/0258183 A1 Aug. 1, 2024

Related U.S. Application Data

(63) Continuation of application No. 16/511,360, filed on Jul. 15, 2019, now Pat. No. 12,009,271.

(51) Int. Cl.
*H01L 23/16* (2006.01)
*H01L 23/00* (2006.01)
(Continued)

(52) U.S. Cl.
CPC .......... *H01L 23/16* (2013.01); *H01L 23/3185* (2013.01); *H01L 23/49822* (2013.01); *H01L 23/49838* (2013.01); *H01L 24/16* (2013.01); *H01L 25/0655* (2013.01); *H01L 2224/16227* (2013.01); *H01L 2924/18161* (2013.01)

(58) Field of Classification Search
None
See application file for complete search history.

(56) References Cited

U.S. PATENT DOCUMENTS

| | | | |
|---|---|---|---|
| 12,009,271 B2 * | 6/2024 | Cetegen | H01L 24/92 |
| 2010/0187672 A1 * | 7/2010 | Yamamoto | H05K 3/305 |
| | | | 257/E23.18 |

(Continued)

*Primary Examiner* — Hung K Vu
(74) *Attorney, Agent, or Firm* — Schwabe, Williamson & Wyatt P.C.

(57) ABSTRACT

Embodiments disclosed herein include electronic packages with underfill flow control features. In an embodiment, an electronic package comprises a package substrate and a plurality of interconnects on the package substrate. In an embodiment, a die is coupled to the package substrate by the plurality of interconnects and a flow control feature is adjacent on the package substrate. In an embodiment, the flow control feature is electrically isolated from circuitry of the electronic package. In an embodiment, the electronic package further comprises an underfill surrounding the plurality of interconnects and in contact with the flow control feature.

19 Claims, 12 Drawing Sheets

(51) Int. Cl.
*H01L 23/31* (2006.01)
*H01L 23/498* (2006.01)
*H01L 25/065* (2023.01)

(56) References Cited

U.S. PATENT DOCUMENTS

| | | | |
|---|---|---|---|
| 2011/0260338 A1* | 10/2011 | Lee | H01L 23/49811 |
| | | | 257/E21.511 |
| 2011/0275177 A1 | 11/2011 | Yim | |
| 2013/0161810 A1* | 6/2013 | Lin | H01L 23/49894 |
| | | | 257/737 |
| 2014/0001644 A1 | 1/2014 | Yu | |
| 2014/0346673 A1* | 11/2014 | Lin | H01L 21/563 |
| | | | 257/737 |
| 2015/0096787 A1 | 4/2015 | Perng | |
| 2017/0287735 A1* | 10/2017 | Yao | H01L 21/565 |

* cited by examiner

PROTRUDING SN SUBSTRATE FEATURES FOR EPOXY FLOW CONTROL

CROSS-REFERENCE TO RELATED APPLICATIONS

This application is a continuation of U.S. patent application Ser. No. 16/511,360, filed on Jul. 15, 2019, the entire contents of which is hereby incorporated by reference herein.

TECHNICAL FIELD

Embodiments of the present disclosure relate to semiconductor devices, and more particularly to protruding features on the package substrate to modulate flow of epoxy.

BACKGROUND

Capillary underfill process is driven by the epoxy wetting substrate side and die side components (e.g., solder resist, bumps, solder, etc.). The controllable parameters that may be used to modify the capillary underfill process are limited. For example, the capillary underfill process may be modified by changing the epoxy shot weight, dispense number, and the distance from the die.

In addition to the controllable factors listed above, the topography of the die and the package may also alter path of the epoxy. For example, spaces between neighboring die may provide low resistance pathways for the epoxy compared to the path of the epoxy through an array of interconnects. Accordingly, the epoxy may advance faster along the edge of the die than through the center of the die. This is particularly problematic, as such flow conditions may result in the formation of voids in the underfill beneath the die.

There have been proposed solutions to modify the flow of the underfill (e.g., trenches into the package substrate, epoxy barriers, or ink barriers). However, each of these options increases the cost of assembly since additional deposition processes, etching processes, and/or additional toolsets are needed to produce the features. Epoxy and ink barriers also suffer from poor control of the shape and positioning of the features. Furthermore, such solutions only provide reductions in the flow rate or completely stop the flow of the epoxy. The solutions do not provide the ability to increase the flow rate of the epoxy.

EMBODIMENTS OF THE PRESENT DISCLOSURE

Described herein are electronic packages with protruding features for modulating the flow of epoxies, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
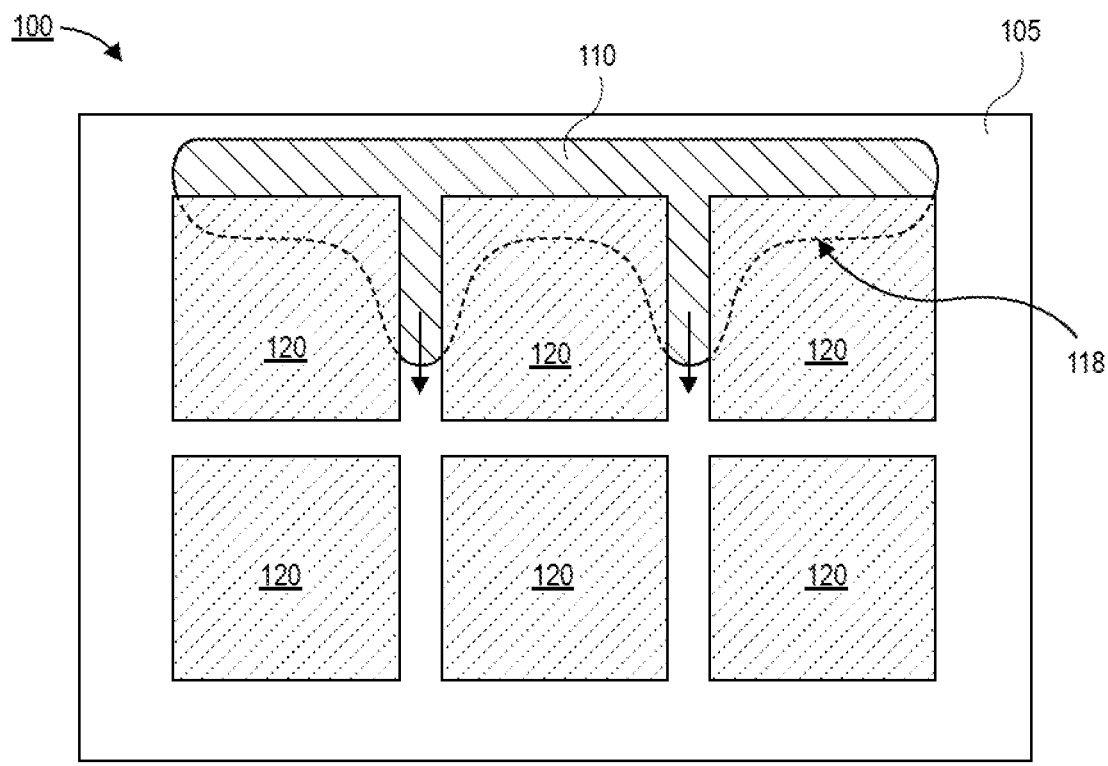
FIG. 1A is a plan view illustration of an array of dies during an underfill process.
Figure 1B:
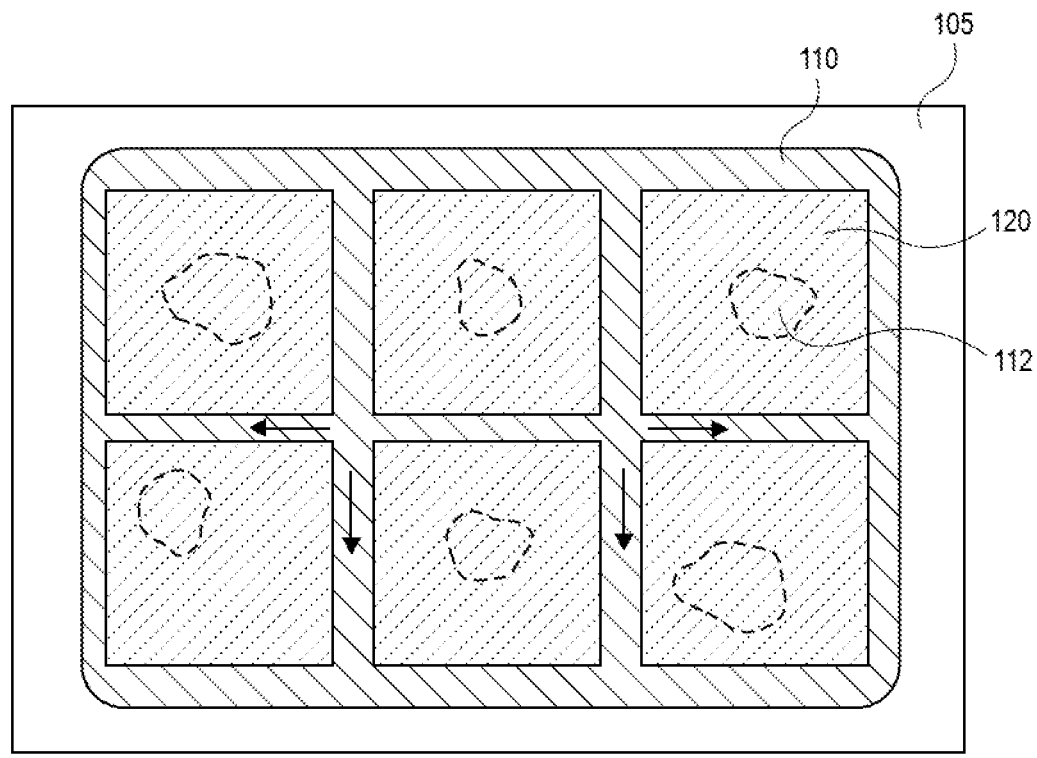
FIG. 1B is a plan view illustration of the array of dies in FIG. 1A after the underfill process that depicts the formation of voids below the dies.

As noted above, uncontrolled capillary flow of an underfill epoxy in an electronic package may lead to significant defects. For example, uncontrolled (or improperly controlled) underfilling may lead to the production of voids in the package. An example of how such voids are formed is shown in FIGS. 1A and 1B. In FIG. 1A an electronic package 100 with a plurality of dies 120 over a package substrate 105 is shown. An underfill 110 is flown under the dies 120 (as indicated by the dashed lines) to provide an underfill layer under and around the dies 120. However, the underfill 110 advances more rapidly in the spacing between the dies 120. Accordingly, the leading edge 118 of the underfill exhibits significant peaks along the space between the dies 120. As shown by the arrows in FIG. 1B, the advancing underfill 110 also rapidly advances along cross-streets between dies 120 as well. This produces a pinching effect and results in the formation of voids 112 underneath the dies 120.

Accordingly, embodiments disclosed herein include the use of flow control features in order to modulate the flow characteristics of the underfill. In an embodiment, the flow control features are fabricated using the same processing operations used to form the interconnects to which the dies are attached. For example, the flow control features may comprise a pad and a bump over the pad. The pad and bump of the flow control features may have a variety of shapes (e.g., lines, rings, etc.). Since the flow control features are lithographically defined (using lithography processes already needed for the assembly of the electronic package), the shape, size, and/or positioning of the flow control features can be specified with a high degree of precision. Furthermore, embodiments enable increasing and/or decreasing the flow rate of an underfill. Accordingly, additional design flexibility is provided compared with existing solutions.

Figure 2A:
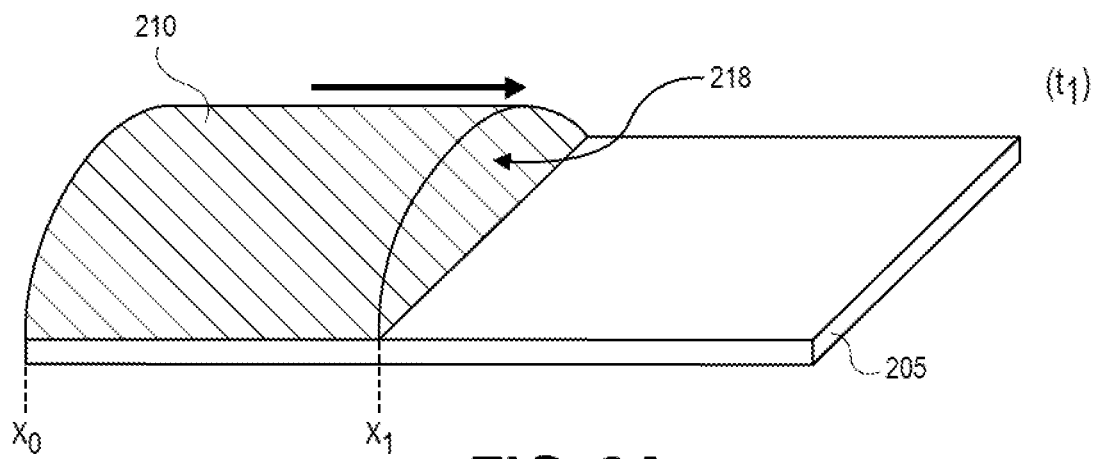
FIG. 2A is a perspective view illustration of an epoxy advancing along a flow direction over a package substrate after a time $t_1$ has elapsed, in accordance with an embodiment.
Figure 2B:
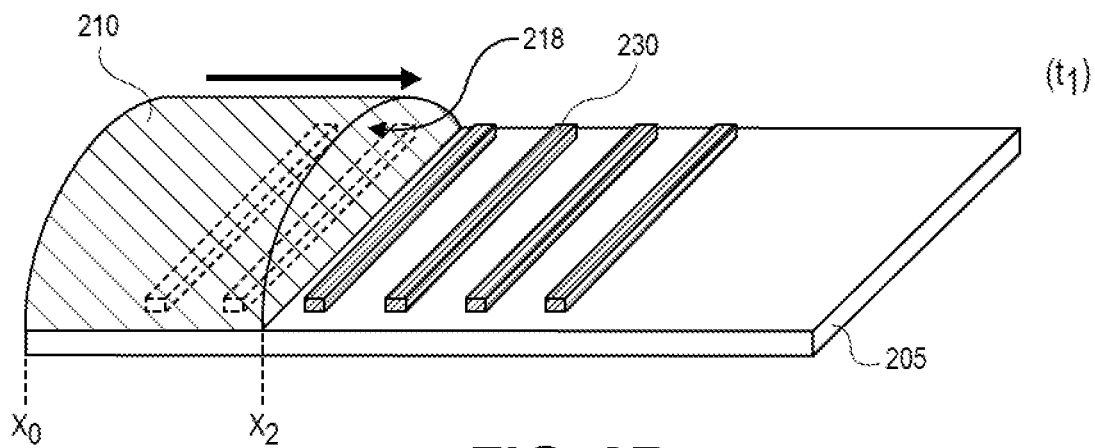
FIG. 2B is a perspective view illustration of an epoxy advancing along a flow direction over a package substrate with a flow control feature after a time $t_1$ has elapsed, in accordance with an embodiment.
Figure 2C:
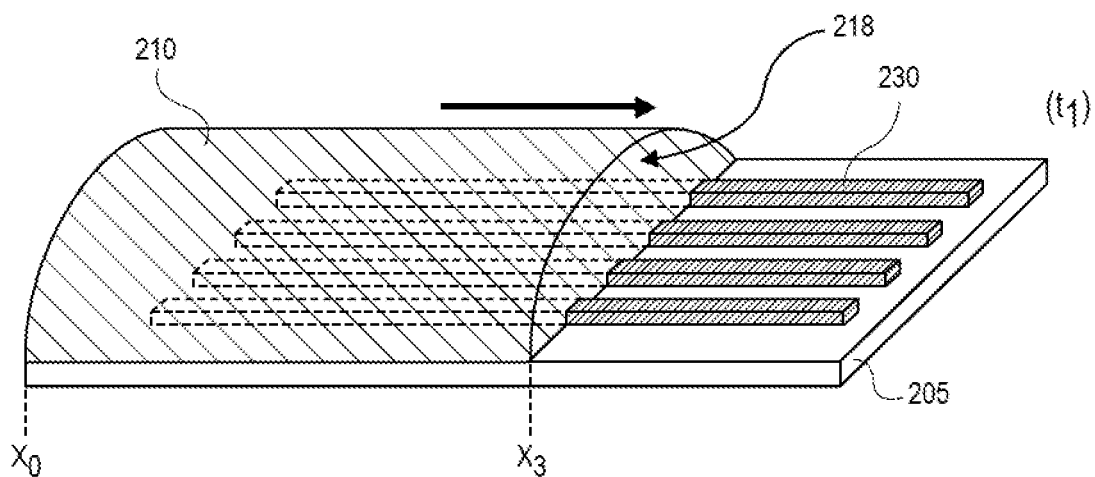
FIG. 2C is a perspective view illustration of an epoxy advancing along a flow direction over a package substrate with a flow control feature after a time $t_1$ has elapsed, in accordance with an embodiment.

Referring now to FIGS. 2A-2C, a series of perspective view illustrations depict the basic mechanisms for modulating the flow rate of an underfill 210 across a package substrate 205. FIGS. 2A-2C depict the flow after an arbitrary amount of time $t_1$. FIG. 2A depicts the flow of an underfill 210 across a package substrate 205 without any flow control features. At time $t_1$ the leading edge 218 of the underfill 210 has advanced a distance $X_1$.

Referring now to FIG. 2B, the flow of an underfill 210 across a package substrate 205 with a flow control feature 230 that comprises lines that are orthogonal to the direction of flow (as indicated by the arrow) is shown, in accordance with an embodiment. As shown, the leading edge 218 of the underfill 210 has advanced a distance $X_2$ at time $t_1$. $X_2$ is less than $X_1$ and indicates that the flow rate has been slowed by the flow control feature 230. The flow rate of the underfill 210 is decreased because a pinching point is formed at the edge of each of the lines that the underfill passes over.

Referring now to FIG. 2C, the flow of an underfill 210 across a package substrate 205 with a flow control feature 230 that comprises lines that are parallel to the direction flow (as indicated by the arrow) is shown, in accordance with an embodiment. As shown, the leading edge 218 of the underfill 210 has advanced a distance $X_3$ at time $t_1$. $X_3$ is greater than $X_1$ and indicates that the flow rate has be increased by the flow control feature 230. The flow rate of the underfill 210 is increased because the parallel lines increase the capillary pressure.

In FIGS. 2B and 2C, the lines of the flow control features 230 are shown as being orthogonal (FIG. 2B) and parallel (FIG. 2C) to the flow direction of the underfill 210. However, it is to be appreciated that lines of the flow control feature 230 may be oriented at any angle with respect to the flow direction of the underfill in order to provide a flow rate between the flow rates over parallel lines and orthogonal lines. Additionally, a flow control feature 230 may be a hybrid flow control feature that comprises both parallel lines and orthogonal lines, as will be described in greater detail below.

Figure 3A:
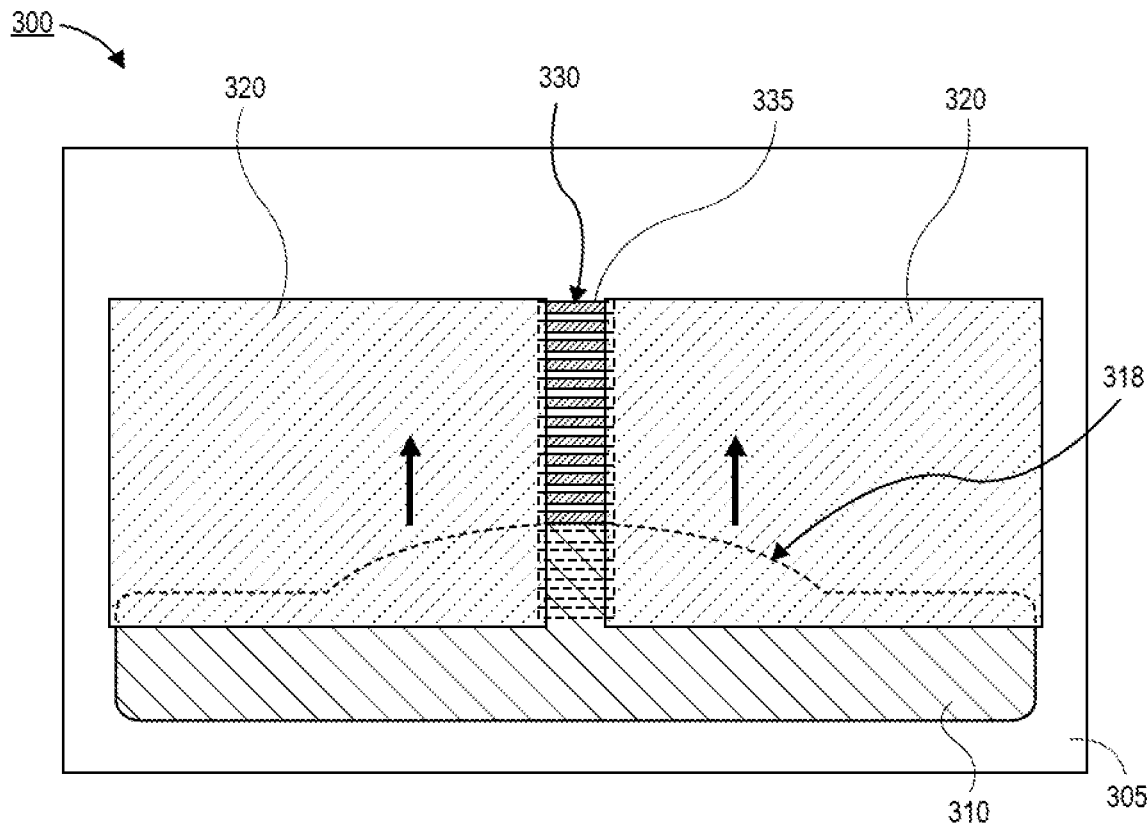
FIG. 3A is a plan view illustration of an electronic package with a pair of dies and a flow control feature between the dies, in accordance with an embodiment.

Referring now to FIG. 3A a plan view illustration of an electronic package 300 is shown, in accordance with an embodiment. In an embodiment, the electronic package 300 may comprise a package substrate 305. The package substrate 305 may comprise layers of dielectric material. For example, a plurality of dielectric layers may be laminated over each other. In some embodiments, a topmost surface of the package substrate 305 may comprise a solder resist layer. In an embodiment, the package substrate 305 may comprise conductive features (e.g., traces, vias, pads, etc.), embedded interposers, or any other component typical of electronic packages.

In an embodiment, the electronic package 300 may comprise a plurality of dies 320. For example, a pair of dies 320 are depicted in FIG. 3A. In an embodiment, the dies 320 may be any type of die. For example, the dies 320 may comprise one or more of a processor die, a graphics die, a memory die, and the like. The dies 320 may be electrically and mechanically coupled to the package substrate 305 by interconnects below the die 320 (not visible in FIG. 3A).

In an embodiment, the electronic package 300 may comprise a flow control feature 330 between the dies 320 in order to control the flow rate of an underfill material dispensed in a direction illustrated by the arrows. In an embodiment, the flow control feature 330 may comprise a plurality of lines 335. The lines 335 may extend from an edge of one die 320 to an edge of the other die 320. In some embodiments, a portion of the line 335 may extend below a footprint of the die 320 (as shown by the dashed boxes). However, in other embodiments, the lines 335 may be entirely outside of a footprint of one or both dies 320. In an embodiment, the lines 335 may be substantially orthogonal to the flow direction of the underfill 310.

Since the lines 335 are substantially orthogonal to the flow direction of the underfill 310, the flow rate of the underfill is reduced across the flow control feature 330. The reduction in the flow rate helps to counteract the increased flow rate through the spacing between the dies 320. Accordingly, instead of having a leading edge 318 of the underfill 310 that has a severe peak along the gap between the dies 320 (as shown in FIG. 1A), the peak (if present) of the leading edge 318 is reduced so that there is less likelihood of void formation as the underfill advances.

Figure 3B:
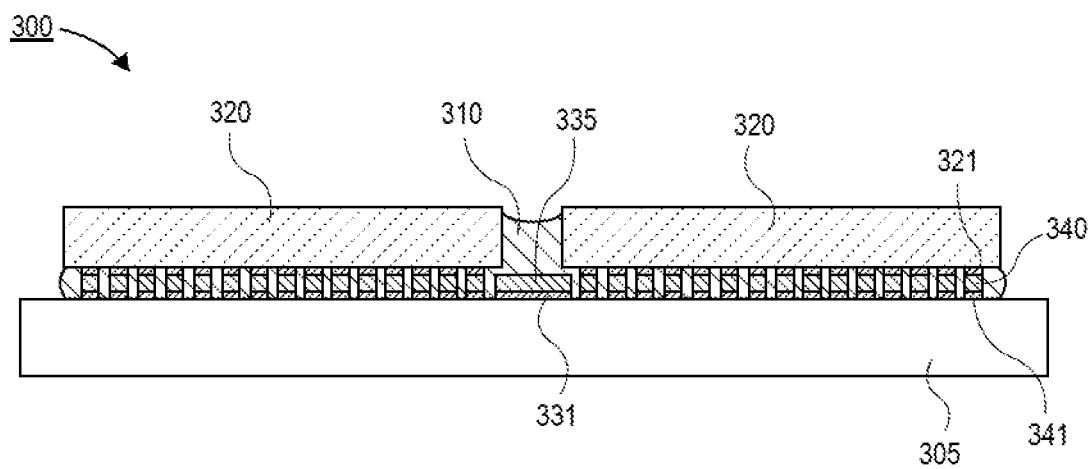
FIG. 3B is a cross-sectional illustration of the electronic package in FIG. 3A, in accordance with an embodiment.

Referring now to FIG. 3B, a cross-sectional illustration of the electronic package 300 is shown, in accordance with an embodiment. As shown, the dies 320 are electrically and physically coupled to the package substrate 305 by interconnects. The interconnects may comprise a plurality of pads 341 and a plurality of bumps 340 over the pads. For example, the pads 341 may be copper pads and the bumps 340 may be solder bumps. The bumps 340 may be coupled to die pads 321. In an embodiment, the bumps 340 may be plated bumps (e.g., plated with an electrolytic plating process or the like).

In an embodiment, the line 335 may be disposed over a flow control pad 331. In an embodiment, the flow control pad 331 may be formed in parallel with the pads 341, and the line 335 may be formed in parallel with the bumps 340. That is, the flow control pad 331 may be lithographically patterned and the line 335 may be plated (e.g., with an electrolytic plating process, or the like). Accordingly, the formation of the flow control feature 330 (which comprises a plurality of lines 335 and flow control pads 331) includes no additional patterning or deposition processes.

In an embodiment, the flow control feature 330 may be electrically isolated from circuitry of the electronic package 300. That is, the lines 335 may not be electrically connected to circuitry of the dies 320 or the package substrate 305. In contrast, the interconnects (comprising the bumps 340 and pads 341) are electrically coupled to circuitry of the dies 320 and the package substrate 305.

Figure 4A:
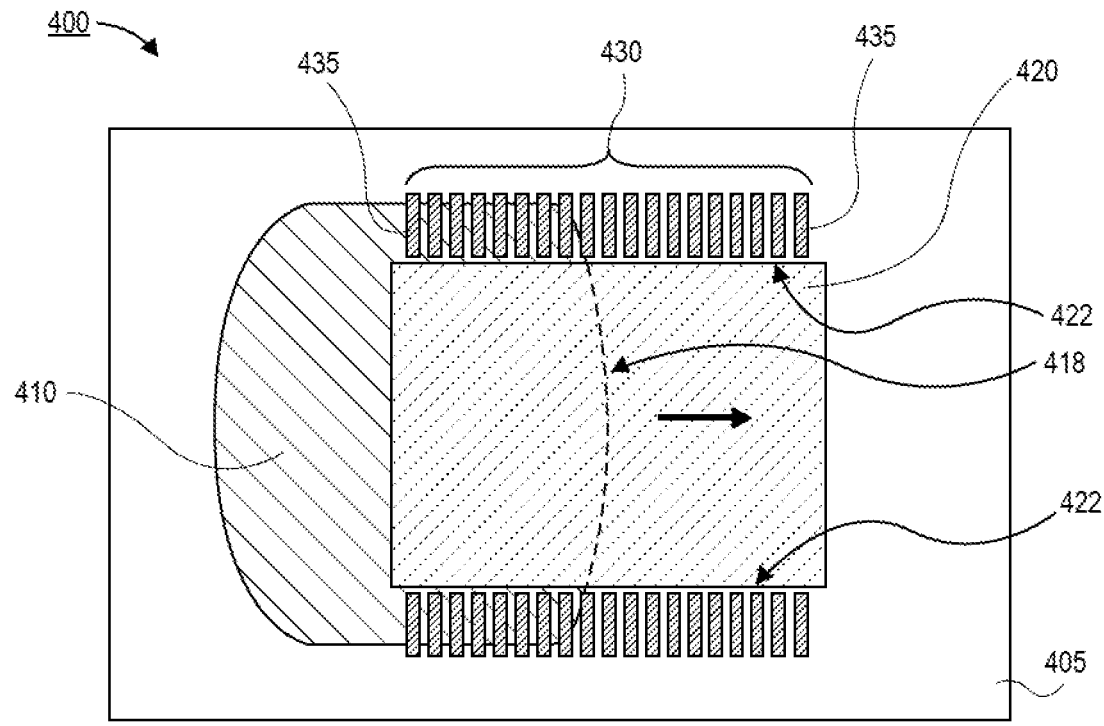
FIG. 4A is a plan view illustration of an electronic package with a die and flow control features along opposite edges of the die, in accordance with an embodiment.

Referring now to FIG. 4A, a plan view illustration of an electronic package 400 is shown, in accordance with an embodiment. In an embodiment, the electronic package 400 may comprise a package substrate 405 and a die 420 attached to the package substrate 405. The die 420 and the package substrate 405 may be substantially similar to the package substrate 305 and dies 320 described above. In an embodiment, the die 420 may comprise edges 422 that are substantially parallel to the flow direction (as indicated by the arrow) of an underfill 410.

In an embodiment, the electronic package 400 may further comprise a pair of flow control features 430. For example, the flow control features 430 may be adjacent to each of the edges 422 of the die 420. In the illustrated embodiment, the flow control features comprise a plurality of lines 435. The lines 435 may be substantially parallel to each other. In an embodiment, the lines 435 may be substantially orthogonal to the flow direction of the underfill. As such, the flow rate of the underfill 410 along the edges 422 of the die 420 is reduced in order to provide a more uniform leading edge 418 of the underfill. For example, the leading edge 418 may be convex.

Figure 4B:
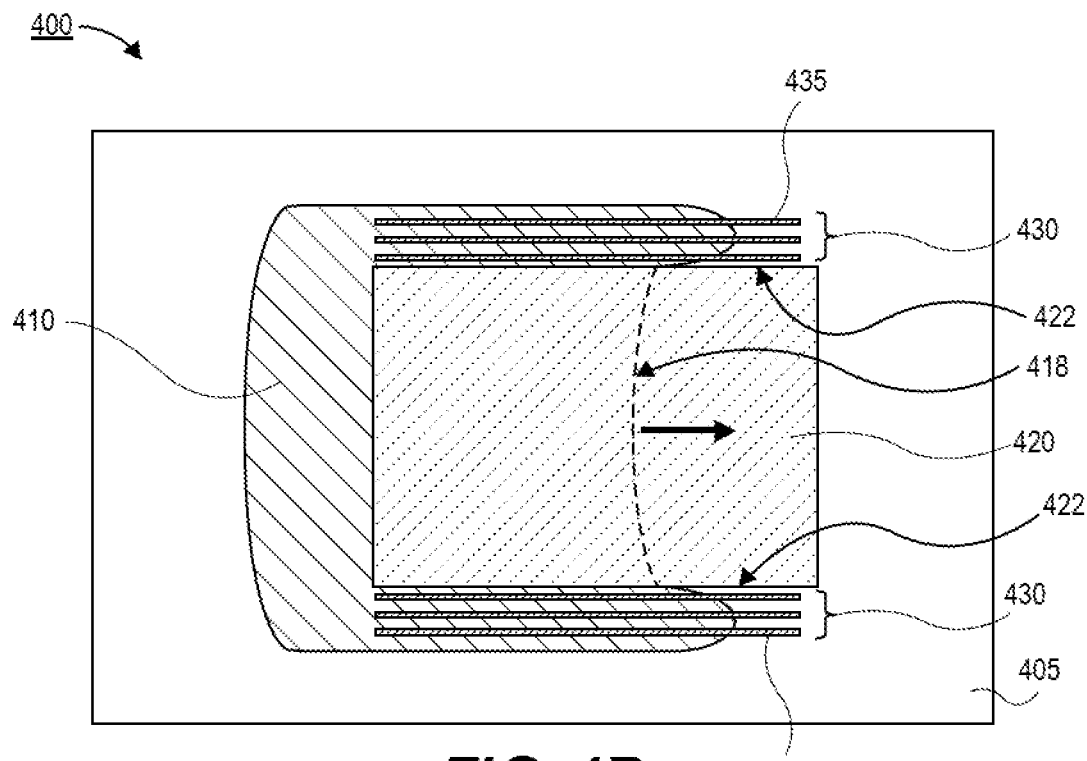
FIG. 4B is a plan view illustration of an electronic package with a die and flow control features along opposite edges of the die, in accordance with an additional embodiment.

Referring now to FIG. 4B, a plan view illustration of an electronic package 400 is shown in accordance with an additional embodiment. In an embodiment, the electronic package 400 in FIG. 4B may be substantially similar to the electronic package 400 in FIG. 4A with the exception that the flow control features 430 comprises lines 435 that run substantially parallel to the flow direction (as indicated by the arrow) of the underfill 410. In an embodiment, the parallel lines 435 provide an increased flow rate of the underfill along the edges 422 of the die 420. Accordingly, the leading edge 418 of the underfill 410 may be concave.

Figure 4C:
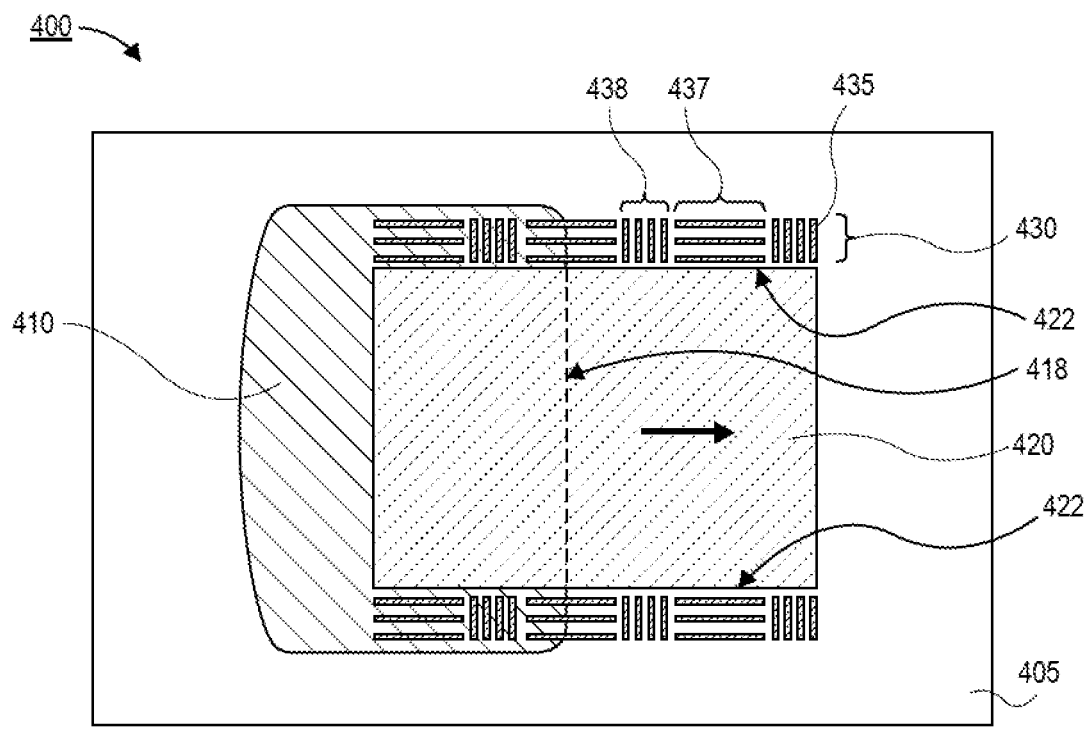
FIG. 4C is a plan view illustration of an electronic package with a die and hybrid flow control features, in accordance with an embodiment.

Referring now to FIG. 4C, a plan view illustration of an electronic package 400 is shown, in accordance with an additional embodiment. In an embodiment, the electronic package 400 in FIG. 4C may be substantially similar to the electronic package 400 in FIG. 4A with the exception that the flow control features 430 are hybrid flow control features 430. That is, the flow control features 430 may include first portions 437 and second portions 438. The first portions 437 may have lines 435 that are substantially parallel to the flow direction of the underfill 410, and the second portions 438 may have lines 435 that are substantially orthogonal to the flow direction of the underfill 410.

In an embodiment, the first portions 437 and the second portions 438 may be alternated in order to provide a desired flow rate along the edges 422 of the die 420. For example, the number and/or length of first portions 437 and the number and/or length of the second portions 438 may be chosen to provide a flow rate along the edges 422 of the die 420 that matches a flow rate of the underfill 410 underneath the die 420. In such embodiments, the leading edge 418 of the underfill 410 may be substantially straight. In an embodiment, the leading edge 418 of the underfill may modulate between concave and convex as the leading edge passes between the first portions 437 and the second portions 438. In some embodiments, the average profile of the leading edge 418 as it passes across the die 420 may be substantially straight.

Figure 4D:
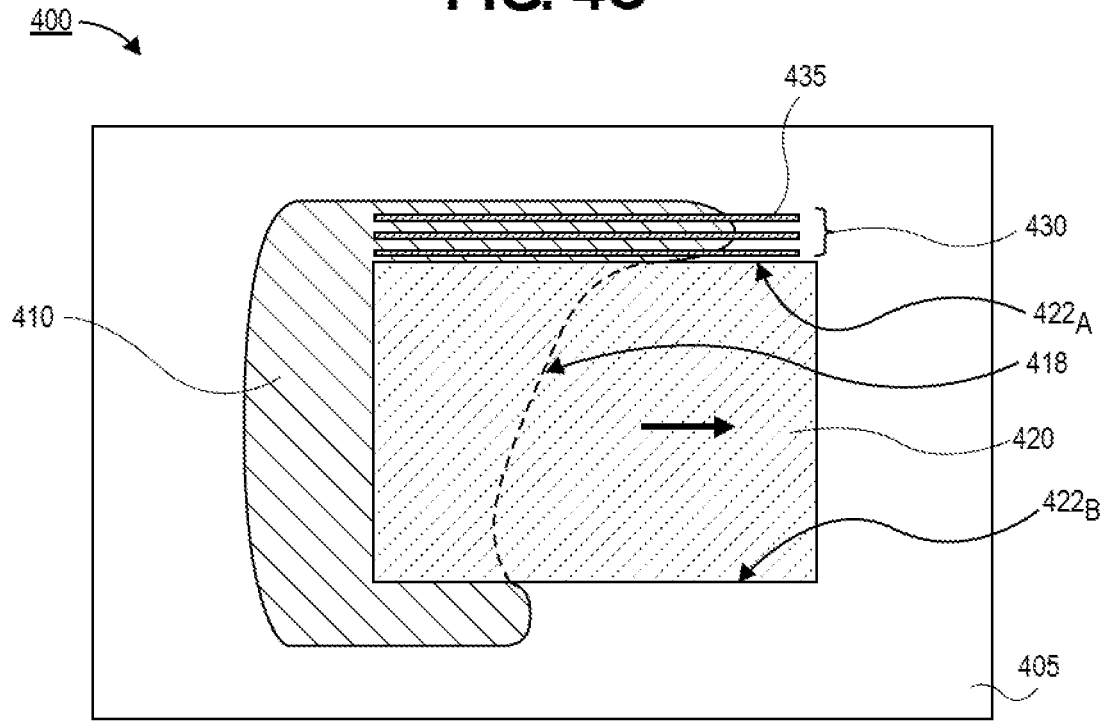
FIG. 4D is a plan view illustration of an electronic package with a die and a flow control feature along a single edge of the die, in accordance with an embodiment.

Referring now to FIG. 4D, a plan view illustration of an electronic package 400 is shown, in accordance with an additional embodiment. In an embodiment, the electronic package 400 in FIG. 4D may be substantially similar to the electronic package 400 in FIG. 4B, with the exception that a single flow control feature 430 is provided. For example, the flow control feature 430 is only provided along edge $422_A$, and the opposite edge $422_B$ does not include a flow control feature 430. In such embodiments, the flow rate of underfill 410 the along the first edge $422_A$ may be different than the flow rate of the underfill 410 along the second edge $422_B$. Particularly, since the flow control feature 430 comprises lines 435 that are parallel to the flow direction, the flow rate along edge $422_A$ will be greater than the flow rate along edge $422_B$. However, it is to be appreciated that if flow control feature 430 comprises lines 435 that are orthogonal to the flow direction, the flow rate along edge $422_A$ will be less than the flow rate along edge $422_B$.

Furthermore, while edge $422_B$ does not include a flow control feature, it is to be appreciated that embodiments may include a flow control feature 430 along edge $422_B$ that is different than the flow control feature 430 along edge $422_A$. For example, the flow control feature 430 along edge $422_A$ may comprise lines 435 parallel to the flow direction and the flow control feature 430 along edge $422_B$ may comprise lines 435 orthogonal to the flow direction. In other embodiments, hybrid flow control features 430 may be positioned next to one or both of the edges $422_A$ and $422_B$.

In an embodiment, the flow control features 430 described in FIGS. 4A-4D may be substantially similar to the flow control feature 330 described with respect to FIGS. 3A and 3B. That is, the flow control features 430 may comprise a flow control pad (not shown) with the lines 435 over the pads. In an embodiment, the flow control features 430 may be formed in parallel with interconnects (not visible) between the die 420 and the package substrate 405. In an embodiment, the flow control features 430 may be electrically isolated from the circuitry of the electronic package 400.

Figure 5A:
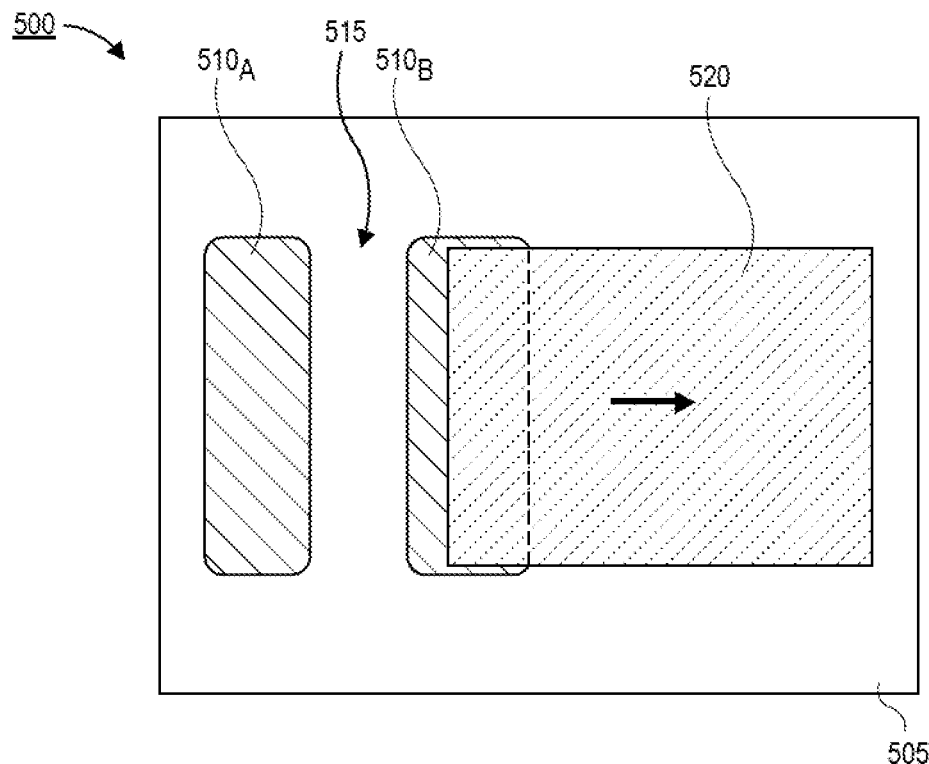
FIG. 5A is a plan view illustration depicting an attempt to dispense underfill on an electronic package where the source region of the underfill is detached from the advancing portion of the underfill.
Figure 5B:
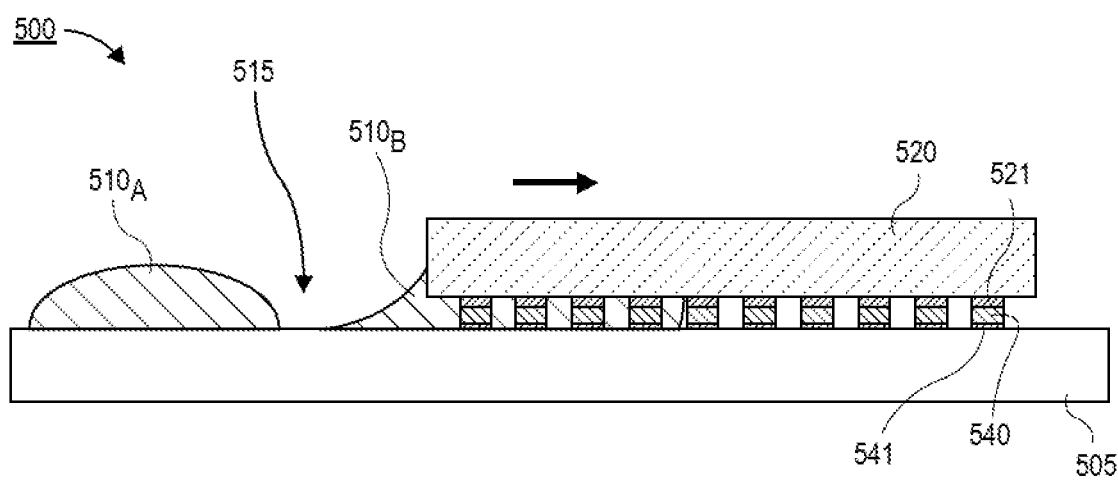
FIG. 5B is a cross-sectional illustration of the electronic package in FIG. 5A.

Referring now to FIGS. 5A and 5B, a plan view illustration and a cross-sectional illustration of an electronic package 500 are shown, respectively. The electronic package 500 in FIGS. 5A and 5B include a package substrate 505 and a die 520 coupled to the package substrate 505. As shown, an underfill 510 is flown under the die 520 and around the interconnects comprising pads 541, bumps 540 and die pads 521. The underfill 510 is dispensed at an underfill source region $510_A$ and flows towards the die 520 (as indicated by the arrow). However, the capillary suction once a portion of the underfill $510_B$ reaches the die 520 may be greater than the speed at which the underfill source region $510_A$ can supply more underfill 510. As such, necking and ultimately a break 515 between the underfill source region $510_A$ and the underfill $510_B$ may be formed. When a break 515 is formed, the underfill $510_B$ may not have sufficient volume to provide proper underfilling of the die 520.

Accordingly, embodiments disclosed herein include a flow control feature 530 that prevents the formation of a break 515. An example of such an embodiment is shown in FIGS. 5C and 5D.

Figure 5C:
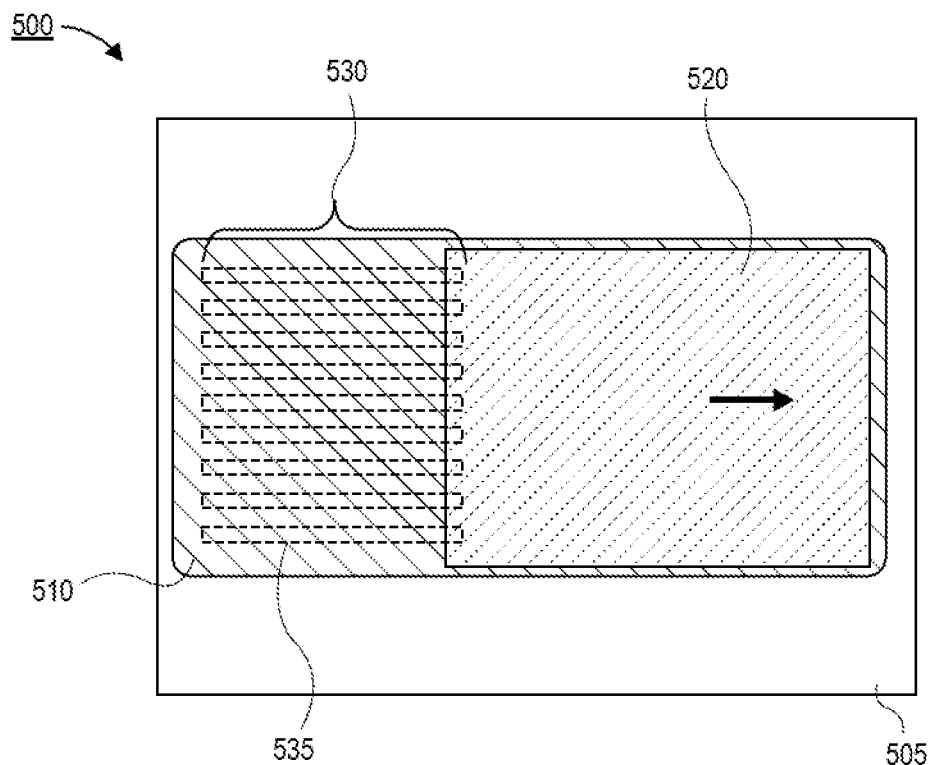
FIG. 5C is a plan view illustration of an electronic package that comprise a die and a flow control feature between an underfill source region and the die, in accordance with an embodiment.
Figure 5D:
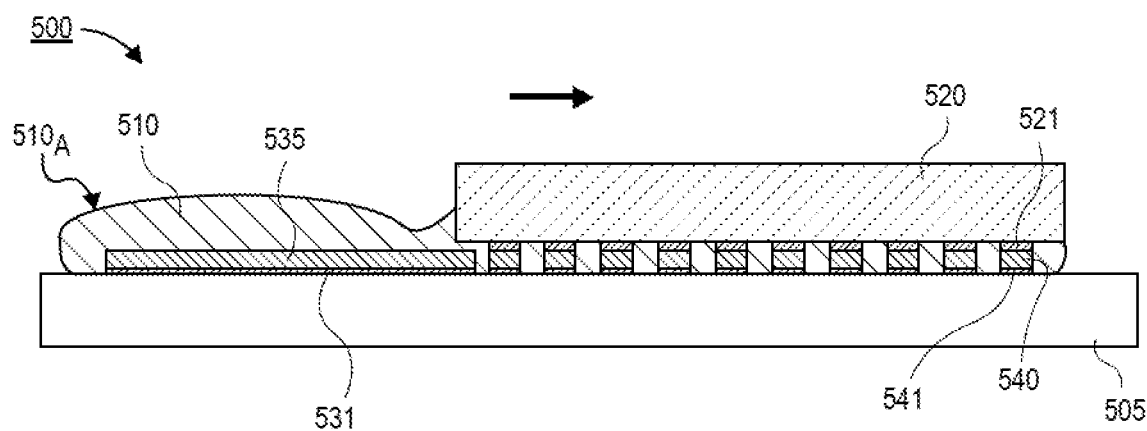
FIG. 5D is a cross-sectional illustration of the electronic package in FIG. 5C, in accordance with an embodiment.

Referring now to FIGS. 5C and 5D, a plan view illustration and a cross-sectional illustration of an electronic package 500 are shown, respectively, in accordance with an embodiment. As shown, the electronic package 500 may comprise a flow control feature 530. Particularly, the flow control feature 530 may comprise a plurality of lines 535 over flow control pads 531. The plurality of lines 535 may run from the source region of the underfill 510 towards the die 520. In an embodiment, the lines 535 may be substantially parallel to the flow direction of the underfill 510 in order to provide an increased flow rate of the underfill 510. The increased flow rate allows for the underfill 510 to be continuously supplied to the die 520 without the generation of break 515. Accordingly, proper underfilling of the die is provided. Such an embodiment is particularly beneficial when the underfill source region is far from the die 520 (as is necessary when the die 520 is relatively thin). Additionally, moving the underfill source region further from the die 520 allows for an increase in the shot weight of the underfill 510 and prevents the underfill 510 from flowing over a top surface of the die 520.

In an embodiment, the flow control features 530 in FIGS. 5C and 5D may be substantially similar to the flow control feature 330 described with respect to FIGS. 3A and 3B. That is, the flow control features 530 may comprise a flow control pad 531 with the lines 535 over the pads. In an embodiment, the flow control features 530 may be formed in parallel with interconnects (i.e., pads 541 and bumps 540) between the die 520 and the package substrate 505. In an embodiment, the flow control features 530 may be electrically isolated from the circuitry of the electronic package 500.

Figure 6A:
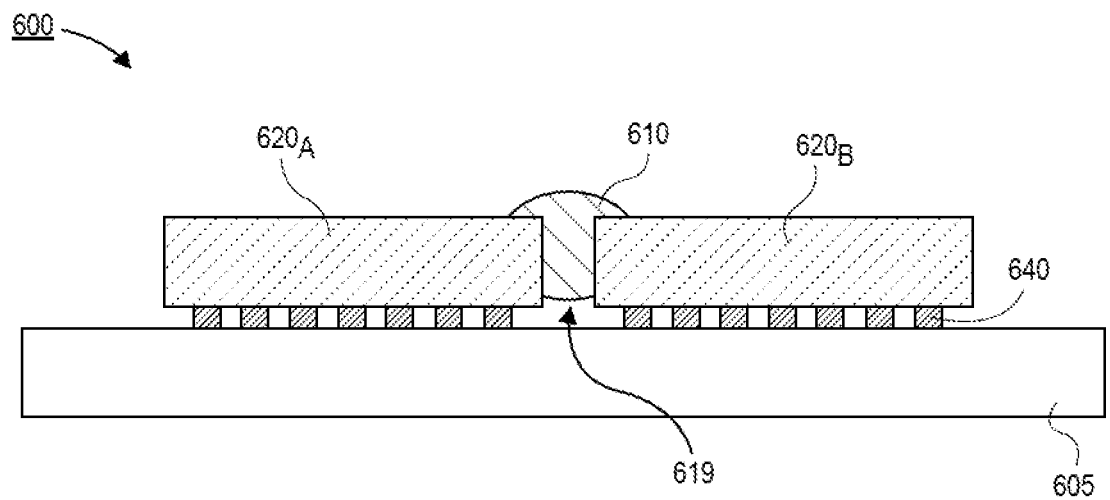
FIG. 6A is a cross-sectional illustration of an underfill process where the underfill epoxy is dispensed from above the dies and the capillary flow is stopped by a pinching point formed by the bottom of the two dies.

Referring now to FIG. 6A, a cross-sectional illustration of an electronic package 600 that depicts another underfilling defect is shown. In FIG. 6A, the electronic package comprises a package substrate 605 and a plurality of dies $620_A$ and $620_B$ that are coupled to the package substrate 605 by interconnects 640. In FIG. 6A, the underfill 610 is dispensed from above the dies $620_A$ and $620_B$. After dispensing, the underfill 610 flows down through the space between the dies $620_A$ and $620_B$. However, the bottom of the two dies $620_A$ and $620_B$ create a pinching point 619 that stops the flow of the underfill 610 and prevents complete underfilling of the dies $620_A$ and $620_B$. Since the underfill 610 is blocked, the underfill 610 accumulates on the top surfaces of the dies $620_A$ and $620_B$ and generates an underfill on die defect.

Accordingly, embodiments disclosed herein include an electronic package 600 that comprises a flow control feature 630 that overcomes the pinching point 619 and provides a wicking down through the spacing between the dies 620 and around the interconnects 640.

Figure 6B:
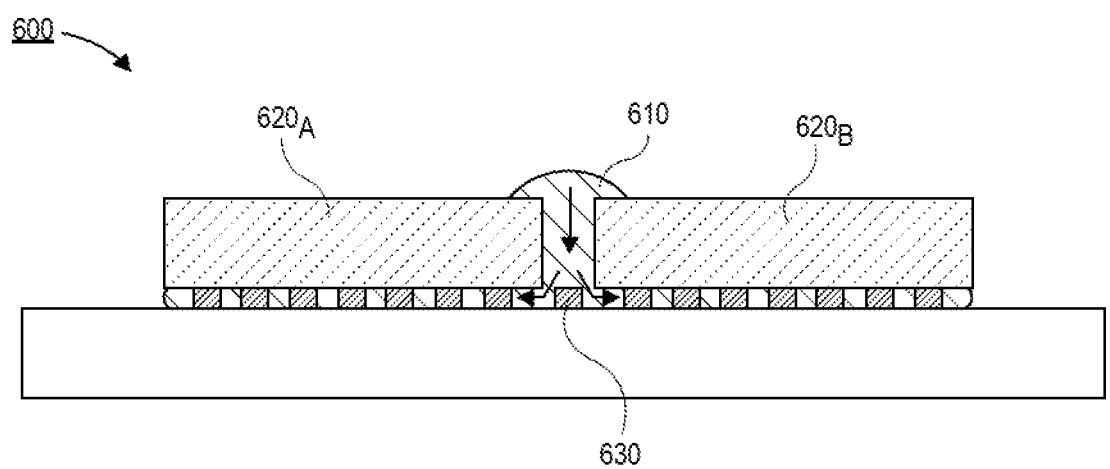
FIG. 6B is a cross-sectional illustration of an electronic package with a flow control feature between a pair of dies that improves the capillary flow by providing a wicking point along the flow direction, in accordance with an embodiment.

Referring now to FIG. 6B, a cross-sectional illustration of an electronic package 600 is shown, in accordance with an embodiment. As indicated by the arrows, the underfill 610 flows down through the spacing between the dies $620_A$ and $620_B$ and laterally towards the interconnects 640. The flow control feature 630 may be positioned over the package substrate 605 and be positioned in the spacing between the dies $620_A$ and $620_B$. Instead of being stuck at the pinch point 619, the underfill 610 is pulled towards the flow control feature 630 and subsequently distributed laterally to provide proper underfilling of the dies $620_A$ and $620_B$.

Figure 6C:
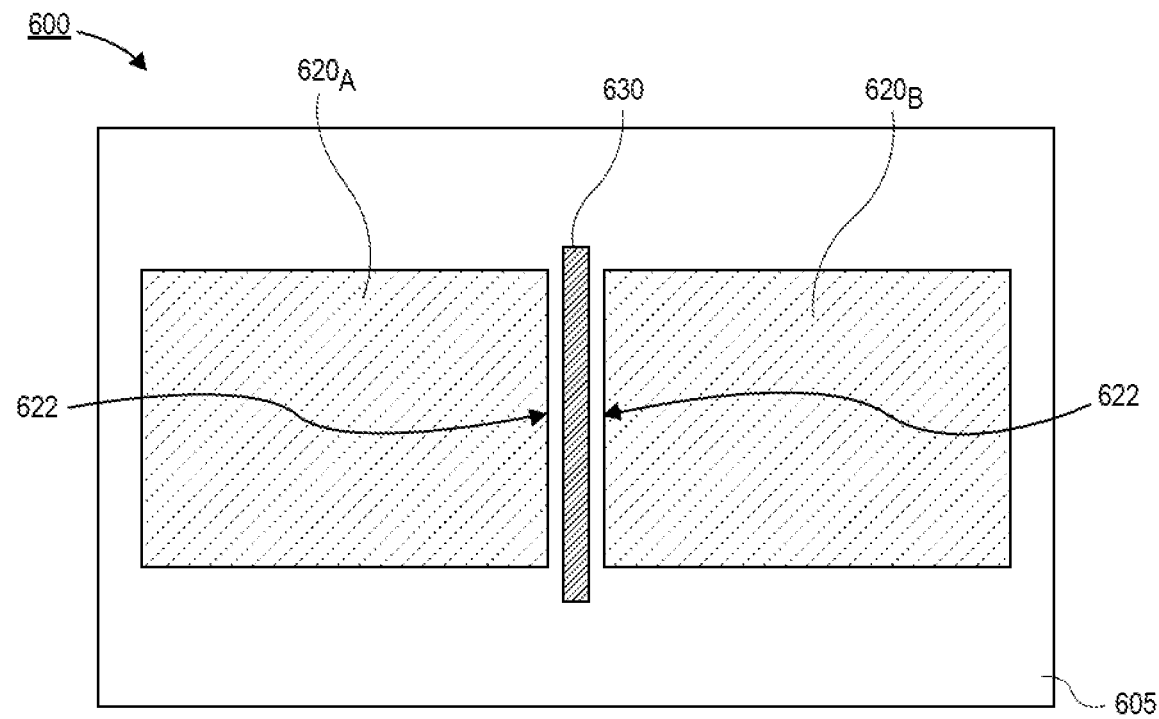
FIG. 6C is a plan view illustration of the electronic package in FIG. 6B where the flow control feature is a line, in accordance with an embodiment.
Figure 6D:
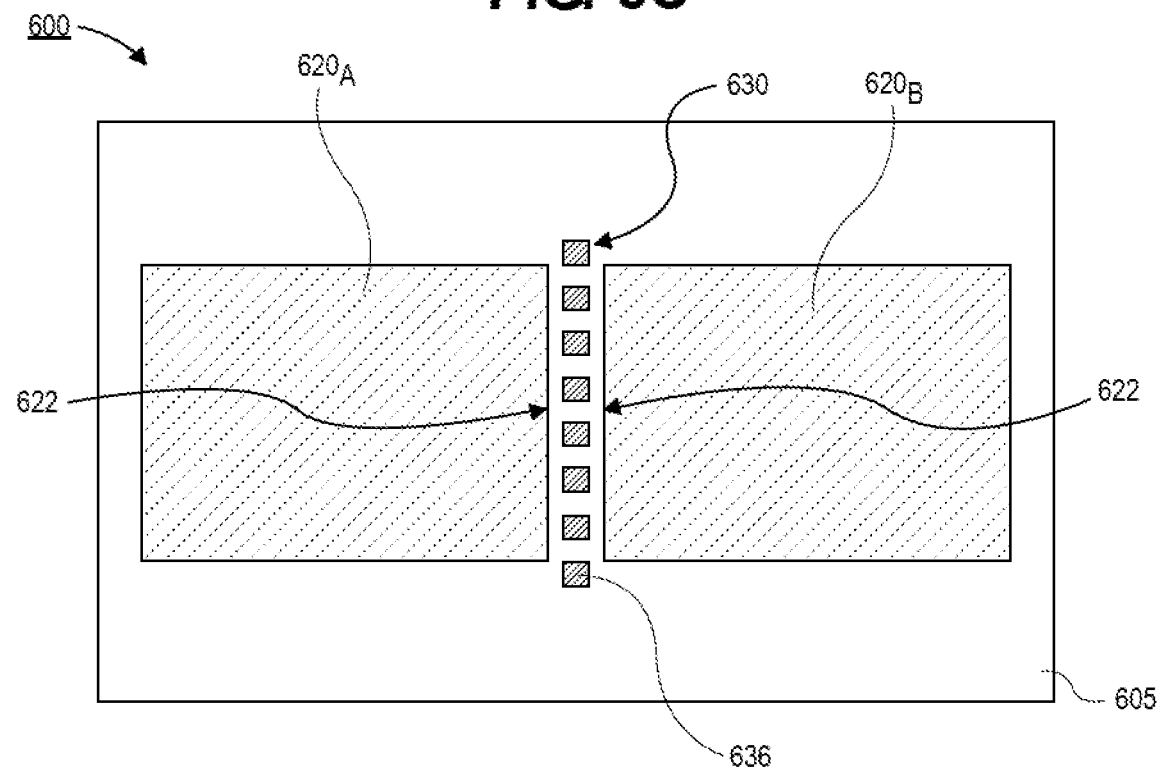
FIG. 6D is a plan view illustration of the electronic package in FIG. 6B where the flow control feature is a plurality of pads, in accordance with an embodiment.

Referring now to FIGS. 6C and 6D, a pair of plan view illustrations of the electronic package 600 are shown, in accordance with various embodiments. In FIG. 6C, the flow control feature 630 comprises a single line that extends substantially along the edges 622 of the dies $620_A$ and $620_B$. In FIG. 6D, the flow control feature 630 comprises a plurality of bumps 636 that extend in a line between the edges 622 of the dies $620_A$ and $620_B$.

In an embodiment, the flow control features 630 in FIGS. 6B-6C may be substantially similar to the flow control feature 330 described with respect to FIGS. 3A and 3B. That is, the flow control features 630 may comprise a flow control pad (not shown) with the lines or bumps over the pads. In an embodiment, the flow control features 630 may be formed in parallel with interconnects 640 between the dies $620_A$ and $620_B$ and the package substrate 605. In an embodiment, the flow control features 630 may be electrically isolated from the circuitry of the electronic package 600.

Figure 7A:
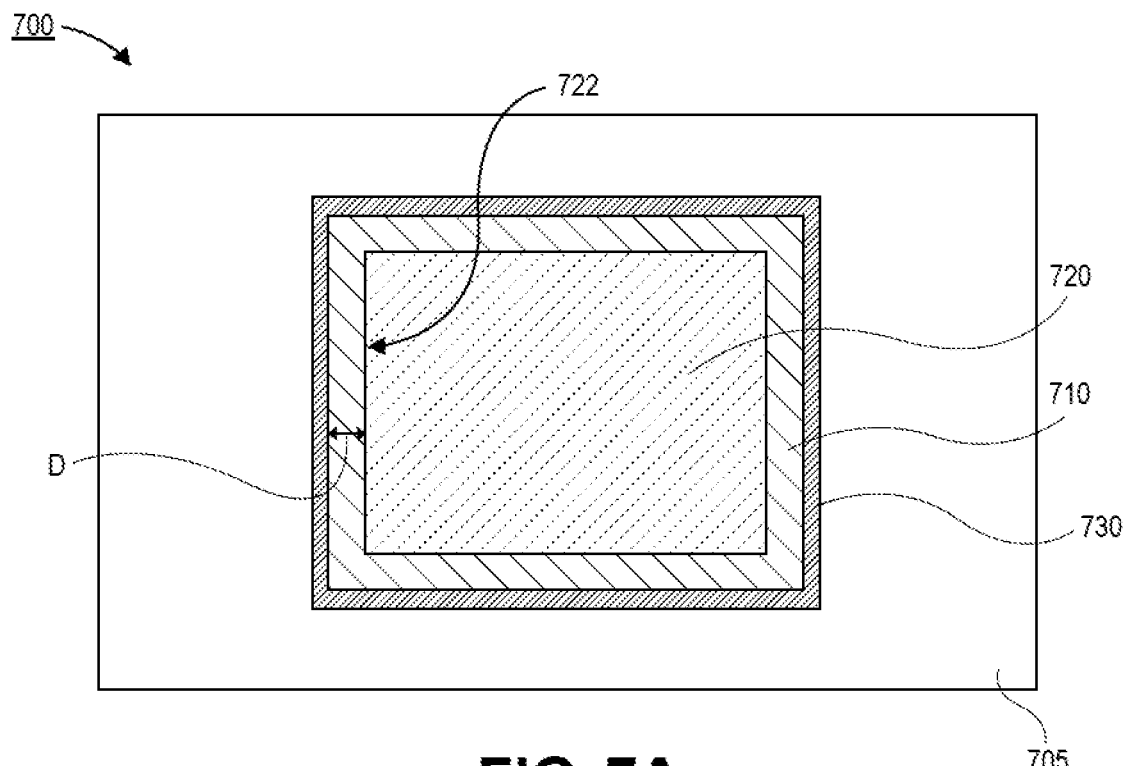
FIG. 7A is a plan view illustration of an electronic package that includes a flow control feature that is a ring around the die, in accordance with an embodiment.

Referring now to FIG. 7A, an electronic package 700 with a flow control feature 730 that is a ring around a die 720 is shown, in accordance with an embodiment. In an embodiment, the flow control feature 730 may encircle a perimeter of the die 720 and function as a dam that prevents the underfill 710 from flowing outwards. In an embodiment, an interior surface of the flow control feature 730 may be spaced away from an edge 722 of the die 720 by a distance D. In an embodiment, the distance D may be approximately 3 mm or less. In an embodiment, the distance D may be approximately 1 mm or less.

Figure 7B:
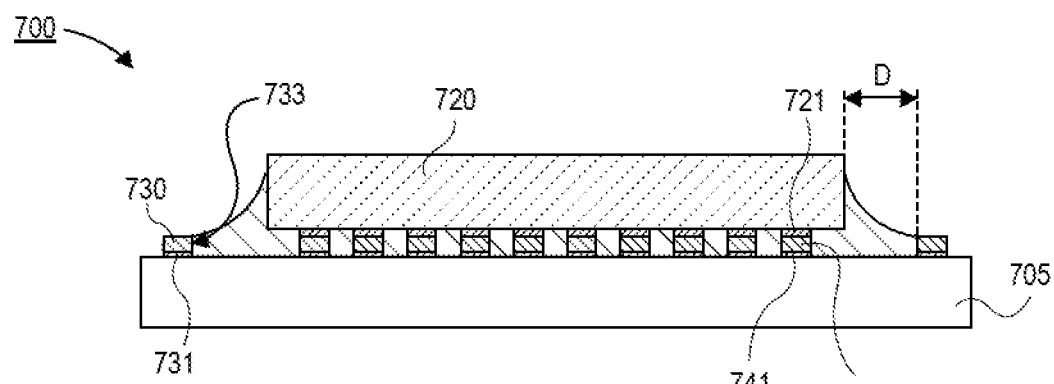
FIG. 7B is a cross-sectional illustration of the electronic package in FIG. 7A, where the underfill only contacts a sidewall of the ring, in accordance with an embodiment.
Figure 7C:
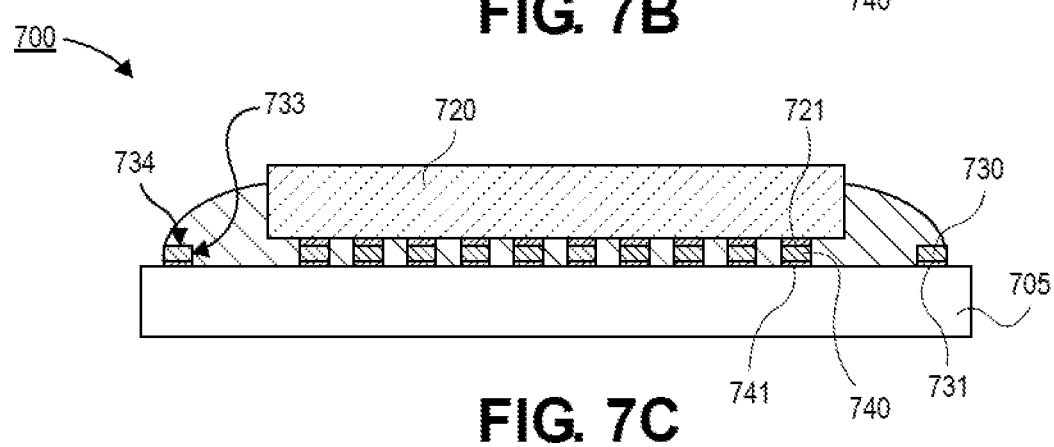
FIG. 7C is a cross-sectional illustration of the electronic package in FIG. 7A, where the underfill contacts a sidewall and a top surface of the ring, in accordance with an embodiment.

Referring now to FIGS. 7B and 7C, cross-sectional illustrations of the electronic package 700 in FIG. 7A are shown, in accordance with various embodiments. As shown, the electronic package comprises a package substrate 705 and a die 720 coupled to the package substrate 705 by interconnects comprising pads 741, bumps 740, and die pads 721. The flow control feature 730 may be disposed over a flow control pad 731. The flow control feature 730 provides a dam that prevents the underfill 710 from flowing laterally away from the die 720. In FIG. 7B, the underfill 710 only contacts a sidewall surface 733 of the flow control feature 730. In FIG. 7C, the underfill 710 contacts a sidewall surface 733 of the flow control feature 730 and a top surface 734 of the flow control feature 730.

In an embodiment, the flow control features 730 in FIGS. 7A-7C may be substantially similar to the flow control feature 330 described with respect to FIGS. 3A and 3B. That is, the flow control features 730 may comprise a flow control pad 731 with lines over the pads. In an embodiment, the flow control features 730 may be formed in parallel with interconnects (i.e., pads 741 and bumps 740) between the die 720 and the package substrate 705. In an embodiment, the flow control features 730 may be electrically isolated from the circuitry of the electronic package 700.

Figure 8:
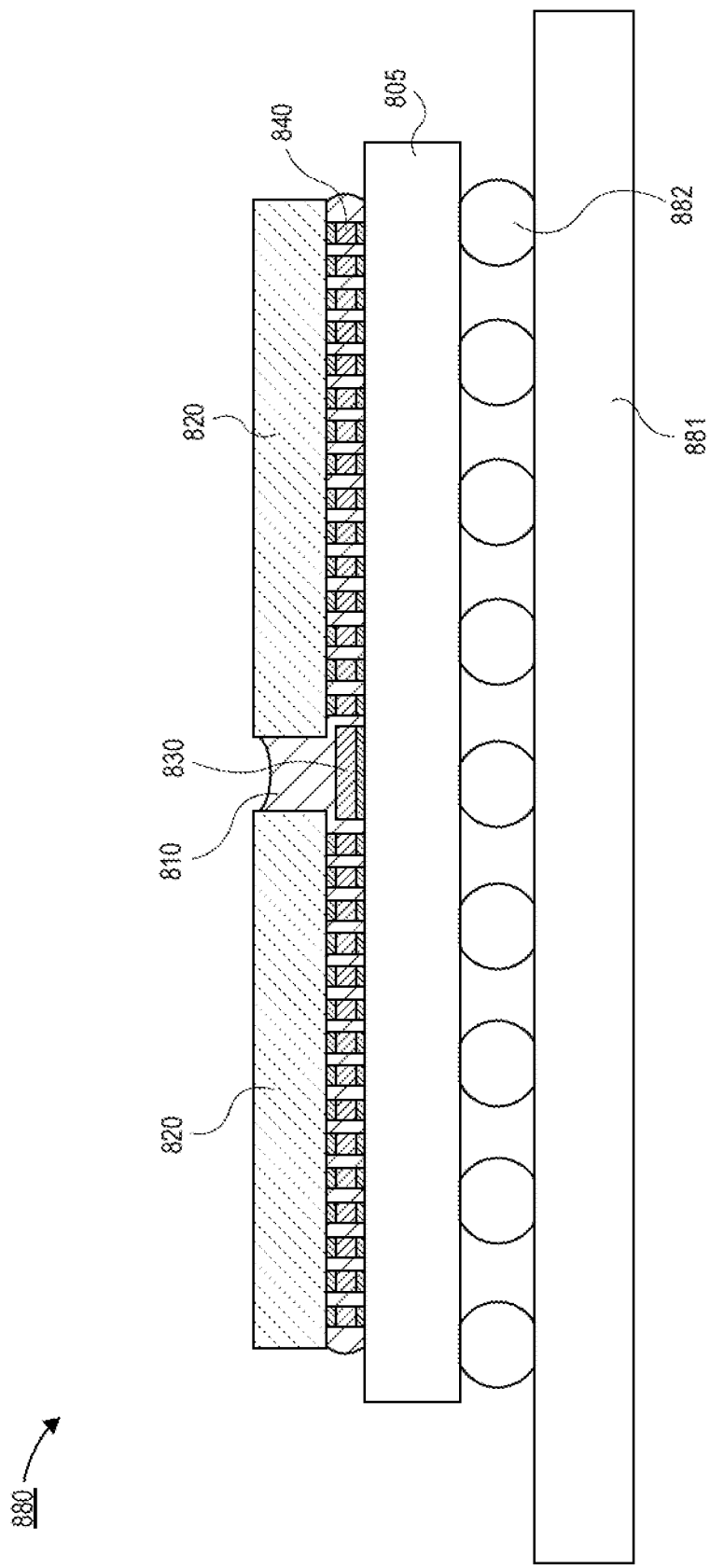
FIG. 8 is a cross-sectional illustration of an electronic system that comprises an electronic package with flow control features, in accordance with an embodiment.

Referring now to FIG. 8, a cross-sectional illustration of an electronic system 880 is shown, in accordance with an embodiment. In an embodiment, the electronic system 880 may comprise a board 881 (e.g., a mother board or the like). A package substrate 805 may be electrically coupled to the board 881 by interconnects 882. In the illustrated embodiment, the interconnects 882 are shown as being solder bumps. However, it is to be appreciated that the interconnects 882 may comprise any interconnect architecture (e.g., wire bonds, sockets, etc.). In an embodiment, one or more dies 820 may be electrically coupled to the package substrate 805 by interconnects 840. The interconnects 840 may be surrounded by an underfill 810. In an embodiment, the electronic system may comprise a flow control feature 830. The flow control feature 830 may be electrically isolated from circuitry of the electronic system 880. In an embodiment, the flow control feature 830 may comprise one or more of the flow control features described above. In the particular embodiment illustrated in FIG. 8, the flow control feature 830 is substantially similar to the flow control feature 330 described with respect to FIGS. 3A and 3B.

Figure 9:
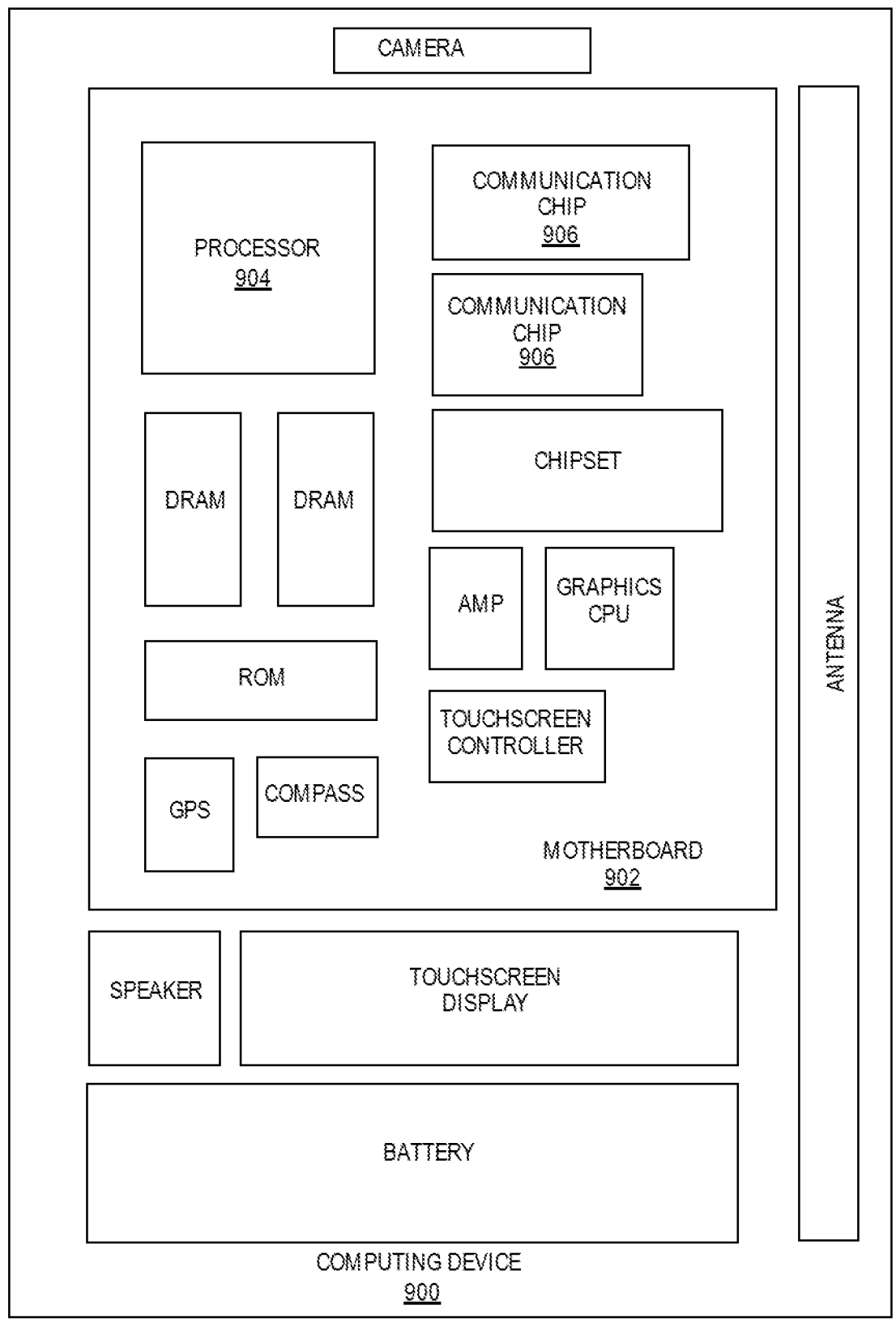
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be packaged to a package substrate that comprises one or more flow control features, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be packaged to a package substrate that comprises one or more flow control features, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a plurality of interconnects on the package substrate; a die coupled to the package substrate by the plurality of interconnects; a flow control feature adjacent on the package substrate, wherein the flow control feature is electrically isolated from circuitry of the electronic package; and an underfill surrounding the plurality of interconnects and in contact with the flow control feature.

Example 2: the electronic package of Example 1, wherein the flow control feature comprises: a plurality of substantially parallel lines.

Example 3: the electronic package of Example 2, wherein the plurality of substantially parallel lines run in a direction substantially parallel to a direction of flow of the underfill.

Example 4: the electronic package of Example 2, wherein the plurality of substantially parallel lines run in a direction substantially orthogonal to a direction of flow of the underfill.

Example 5: the electronic package of Examples 1-4, wherein the flow control feature comprises first lines and second lines, wherein the first lines are substantially orthogonal to the second lines.

Example 6: the electronic package of Examples 1-5, wherein a first flow control feature is adjacent to a first edge of the die and a second flow control feature is adjacent to a second edge of the die, wherein the first edge is opposite the second edge.

Example 7: the electronic package of Example 6, wherein the first flow control feature is substantially similar to the second flow control feature.

Example 8: the electronic package of Example 6, wherein the first flow control feature is different than the second flow control feature.

Example 9: the electronic package of Examples 1-8, further comprising: a second die adjacent to the first die, wherein the flow control feature is positioned between the first die and the second die.

Example 10: the electronic package of Example 1, further comprising: an underfill source region on the package substrate, wherein the flow control feature comprises a plurality of substantially parallel lines that extend from the underfill source region to an edge of the die.

Example 11: the electronic package of Examples 1-10, wherein the flow control feature comprises a ring around a perimeter of the die.

Example 12: the electronic package of Example 11, wherein the underfill contacts an interior sidewall of the ring.

Example 13: the electronic package of claim 12, wherein the underfill further contacts a top surface of the ring.

Example 14: the electronic package of Examples 1-13, wherein the flow control feature comprises a pad and solder over the pad.

Example 15: the electronic package of Examples 1-14, wherein the flow control feature comprises the same material composition as the plurality of interconnects.

Example 16: a package substrate, comprising: a plurality of dielectric layers; a plurality of pads arranged in an array over the plurality of dielectric layers; a plurality of bumps, wherein each bump is over a different one of the plurality of pads; and a flow control feature over the plurality of dielectric layers, wherein the flow control feature comprises one or more lines.

Example 17: the package substrate of Example 16, wherein the one or more lines of the flow control feature run substantially parallel to an edge of the array.

Example 18: the package substrate of Example 16, wherein the one or more lines of the flow control feature run substantially orthogonal to an edge of the array.

Example 19: package substrate of Examples 16-18, wherein the plurality of pads are arranged in a first array and a second array, and wherein the flow control feature is positioned between the first array and the second array.

Example 20: the package substrate of Examples 16-19, wherein the flow control feature comprises the same material as the plurality of bumps.

Example 21: the package substrate of Example 20, wherein the plurality of bumps comprise a solder.

Example 22: an electronic system, comprising: a board; an electronic package electrically coupled to the board, wherein the electronic package comprises a plurality of interconnects arranged in an array and a flow control feature adjacent to the array; a die electrically coupled to the electronic package by the plurality of interconnects; and an underfill material surrounding the plurality of interconnects and in contact with the flow control feature.

Example 23: the electronic system of Example 22, wherein the flow control feature is electrically isolated from circuitry of the electronic system.

Example 24: the electronic system of Example 22 or Example 23, wherein the flow control feature comprises a plurality of lines, and wherein the plurality of lines run substantially parallel to an edge of the array or substantially orthogonal to an edge of the array.

Example 25: the electronic system of Examples 22-24, wherein the flow control feature comprises a solder.

What is claimed is:

1. An electronic package, comprising:
   a package substrate;
   a plurality of interconnects on the package substrate;
   a die coupled to the package substrate by the plurality of interconnects, the die having a footprint;
   a feature on the package substrate, wherein the feature is electrically isolated from circuitry of the electronic package, wherein the feature comprises a plurality of substantially parallel lines, and wherein the feature is continuous from a location within the footprint of the die to a location outside of the footprint of the die; and
   an underfill surrounding the plurality of interconnects and in contact with the feature.

2. The electronic package of claim 1, wherein the plurality of substantially parallel lines is a plurality of substantially parallel metal lines.

3. The electronic package of claim 1, wherein the plurality of substantially parallel lines is a plurality of substantially parallel plated lines.

4. The electronic package of claim 1, wherein the feature comprises a same material composition as the plurality of interconnects.

5. The electronic package of claim 1, wherein the plurality of substantially parallel lines run in a direction substantially parallel to a direction of flow of the underfill.

6. The electronic package of claim 1, wherein the plurality of substantially parallel lines run in a direction substantially orthogonal to a direction of flow of the underfill.

7. The electronic package of claim 1, wherein the feature is adjacent to a first edge of the die and a second feature is adjacent to a second edge of the die, wherein the first edge is opposite the second edge.

8. The electronic package of claim 7, wherein the second feature is substantially similar to the feature.

9. The electronic package of claim 7, wherein the second feature is different than the feature.

10. The electronic package of claim 1, further comprising:
    a second die adjacent to the first die, wherein the feature is positioned between the first die and the second die.

11. An electronic system, comprising:
    a board;
    an electronic package electrically coupled to the board, wherein the electronic package comprises:
      a package substrate;
      a plurality of interconnects on the package substrate;
      a die coupled to the package substrate by the plurality of interconnects, the die having a footprint;
      a feature on the package substrate, wherein the feature is electrically isolated from circuitry of the electronic package, wherein the feature comprises a plurality of substantially parallel lines, and wherein the feature is continuous from a location within the footprint of the die to a location outside of the footprint of the die; and
      an underfill surrounding the plurality of interconnects and in contact with the feature.

12. The electronic system of claim 11, wherein the plurality of substantially parallel lines is a plurality of substantially parallel metal lines.

13. The electronic system of claim 11, wherein the plurality of substantially parallel lines run in a direction substantially parallel to a direction of flow of the underfill.

14. The electronic system of claim 11, wherein the plurality of substantially parallel lines run in a direction substantially orthogonal to a direction of flow of the underfill.

15. The electronic system of claim 11, further comprising:
    a memory coupled to the board.

16. The electronic system of claim 11, further comprising:
    a communications chip coupled to the board.

17. The electronic system of claim 11, further comprising:
    a camera coupled to the board.

18. The electronic system of claim 11, further comprising:
    a battery coupled to the board.

19. The electronic system of claim 11, further comprising:
a display coupled to the board.

\* \* \* \* \*